US006856000B2

(12) United States Patent
Trogolo et al.

(10) Patent No.: US 6,856,000 B2
(45) Date of Patent: Feb. 15, 2005

(54) REDUCE 1/F NOISE IN NPN TRANSISTORS WITHOUT DEGRADING THE PROPERTIES OF PNP TRANSISTORS IN INTEGRATED CIRCUIT TECHNOLOGIES

(75) Inventors: Joe R. Trogolo, Plano, TX (US); William Loftin, Plano, TX (US); William F. Kyser, Jr., Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 10/266,476

(22) Filed: Oct. 8, 2002

(65) Prior Publication Data

US 2004/0065942 A1 Apr. 8, 2004

(51) Int. Cl.[7] .............................................. H01L 29/73
(52) U.S. Cl. ........................ 257/518; 257/525; 257/588
(58) Field of Search .................................. 257/518, 525, 257/588

(56) References Cited

U.S. PATENT DOCUMENTS 5,137,839 A * 8/1992 Niitsu ......................... 438/310
5,552,626 A * 9/1996 Morikawa .................... 257/525

OTHER PUBLICATIONS

N. Siabi–Shahrivar, et al., "Modeling and Characterization of Noise of Polysilicon Emitter Bipolar Transistors," *IEEE 1990 Bipolar Circuits and Technology Meeting 10.2*, pp. 236–238.

* cited by examiner

*Primary Examiner*—Jerome Jackson
(74) *Attorney, Agent, or Firm*—Peter K. McLarty; W. James Brady, III; Frederick J. Telecky, Jr.

(57) ABSTRACT

An interfacial oxide layer (185) is formed in the emitter regions of the NPN transistor (280, 220) and the PNP transistor (290, 200). Fluorine is selectively introduced into the polysilicon emitter region of the NPN transistor (220) to reduce the 1/f noise in the NPN transistor.

3 Claims, 3 Drawing Sheets

REDUCE 1/F NOISE IN NPN TRANSISTORS WITHOUT DEGRADING THE PROPERTIES OF PNP TRANSISTORS IN INTEGRATED CIRCUIT TECHNOLOGIES

FIELD OF THE INVENTION

The present invention relates to a method to reduce the 1/f noise in NPN transistors without degrading the properties in PNP transistors in integrated circuits containing both NPN and PNP transistors.

BACKGROUND OF THE INVENTION

The electrical properties of polycrystalline silicon emitter (poly-emitter) bipolar junction transistors (BJT) are strongly influenced by the properties of the interfacial oxide (IFO) that exists between the polycrystalline silicon (polysilicon) emitter and the crystalline emitter. For example, the current gain ($H_{FE}$) of the BJT can be enhanced by a thicker IFO layer. The current gain $H_{FE}$ is defined as the ratio of the corresponding change in transistor collector current $\delta I_c$ to a change in the transistor base current $\delta I_B$. In addition to a higher $H_{FE}$, an accompanying increase in the Early Voltage (Va) is obtained in PNP transistors for thicker IFO layers. The increase in $H_{FE}$ and accompanying increase in Va are very desirable properties of PNP transistors.

Increasing IFO thickness in NPN transistors was found to dramatically increase the low frequency output noise of the transistor (i.e., 1/f noise). This 1/f noise increase was obtained when the noise was measured using a low resistance external resistance on the base of the NPN transistor. High 1/f noise can have a detrimental effect on the use of NPN transistors in integrated circuit applications such as in the input stage of high performance operational amplifiers. Increasing the thickness of the IFO layer does not appreciably increase the 1/f noise of the PNP transistors.

There is therefore a need for a method to reduce the 1/f noise in NPN transistors containing IFO layers while maintaining the benefits obtained from such layers in PNP transistors.

SUMMARY OF INVENTION

The instant invention describes a method for reducing the 1/f noise in NPN bipolar junction transistors. In particular a collector region is formed in a semiconductor substrate. A base region is formed in the collector region. A partial emitter region is formed in the base region. In an embodiment of the instant invention the collector is n-type and is formed by growing an n-type epitaxial layer. A p-type base region is formed in the collector region by implanting p-type dopants into the collector region. For an n-type partial emitter region, n-type dopants are implanted into the base region. An interfacial oxide layer is then formed on the partial emitter region and a polysilicon layer is formed on the interfacial oxide layer. For an n-type emitter region, n-type dopants are implanted into the polysilicon region over the partial emitter region to complete the emitter region formation. In addition to the n-type dopants, a fluorine containing species is implanted into the polysilicon region to reduce the 1/f noise in the transistor. The fluorine containing species is selectively introduced into the NPN transistor and not in the PNP transistor.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

The instant invention comprises forming a fluorinated IFO in a poly-emitter bipolar junction transistor (BJT). The fluorinated IFO reduces the 1/f noise in NPN transistors without affecting the $H_{FE}$ or Va of the PNP transistor. The method of fluorinated IFO formation comprises introducing a fluorine containing species into the polysilicon emitter of the NPN BJT during formation. The method will be described with reference to an integrated circuit process for forming PNP and NPN transistors. It should however be noted that the method applies to the formation of a fluorinated IFO and can be used in any semiconductor device requiring an IFO.

Figure 1A:
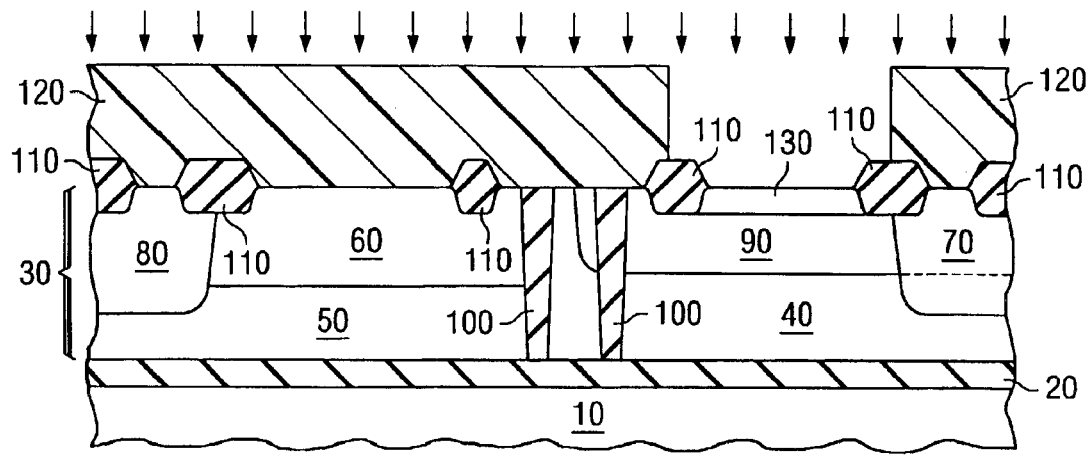
FIGS. 1(a)–1(i) are cross-sectional diagrams illustrating an embodiment of the instant invention.

Shown in FIGS. 1(a)–1(i) are cross-sectional diagrams showing an embodiment of the instant invention. Shown in FIG. 1(a) is a semiconductor substrate after a number of processing steps. As shown in FIG. 1(a), silicon on insulator (SOI) substrates are used in the illustrated embodiment. Silicon on insulator substrates usually comprise a first silicon layer 10, an insulator layer 20 on the first silicon layer, and a second silicon layer 30 in which the transistors will be formed. It should be noted that the instant invention is not limited to silicon on insulator substrates. Any suitable semiconductor substrate can be used with the instant invention. The insulator layer 20 of the SOI substrate is generally comprised of silicon oxide, silicon oxynitride, and/or any suitable insulator layer. Starting with a silicon on insulator substrate, a p-type buried layer 40 is first formed by implanting p-type dopants into the substrate using photolithography and ion implanting technology. Following the formation of the p-type buried layer 40, implanting n-type dopants into the substrate forms an n-type buried layer 50. Following the formation of the n-type buried layer 50 and the p-type buried layer 40, an n-type epitaxial layer of silicon is formed above the buried layers. The n-type epitaxial layer forms a portion of the second silicon layer 30 and a region of the epitaxial layer 60 will be used to form a part of the collector structure of the NPN transistor. A deep n-type region 80 is then formed in the second silicon layer 30 by selectively masking portions of the second silicon layer 30 using photolithographic techniques and implanting n-type dopants into the unmasked regions of the second silicon layer. Selectively masking the second silicon layer 30 and implanting p-type dopants into the unmasked areas then form a p-type region 90 that will comprise a part of the collector structure of the PNP transistor. Selectively masking the upper silicon layer 30 and implanting p-type dopants into the unmasked regions of the upper silicon layer 30 forms the deep p-type region 70. The isolation structures 100 are then formed by first etching trenches in the upper silicon layer 30 and filling the trenches with insulating materials such as silicon oxide and polysilicon. The isolation structures 100 provide electrical isolation for the NPN and PNP transistors. The oxide isolation structures 110 are then formed by selectively oxidizing the surface of the upper silicon layer 30. This process is known as the LOCOS process. Alternatively the isolation structures 110 can be shallow trench isolation (STI) structures formed using known techniques for forming such structures. Following the formation of the isolation structures, an oxide layer is formed on the silicon layer, and then a patterned photoresist film 120 is formed over the second silicon layer. The photoresist film 120 functions as an implant mask during the formation of the n-type base region 130 of the PNP transistor. The n-type base region 130 is formed by implanting n-type dopants into the second silicon layer 30.

Figure 1B:
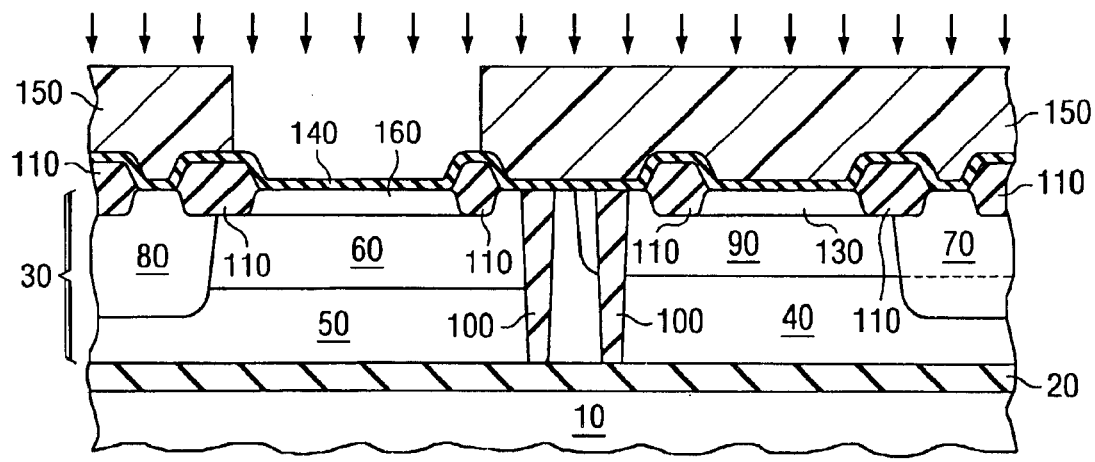

Following the formation of the n-type base region 130 the patterned photoresist film 120 is removed and an oxide layer 140 is formed on the surface of the second silicon layer 30. The oxide layer 140 can be formed using known chemical vapor deposition (CVD) methods. This is shown in FIG. 1(b). A patterned photoresist film 150 is then formed on the second silicon layer 30 and implanting p-type dopants into the exposed region of the second silicon layer forms the p-type base region 160. This is illustrated in FIG. 1(b).

Figure 1C:
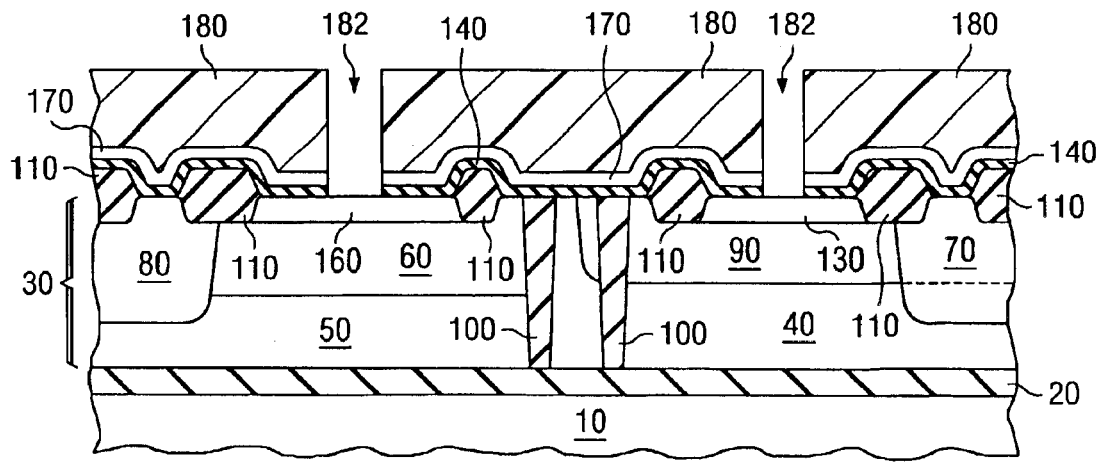

After forming both the n-type base region 130 and the p-type base region 160 a polysilicon layer 170 is formed on the oxide layer 140 as shown in FIG. 1(c). A patterned photoresist film 180 is formed on the polysilicon layer 170 and the exposed regions of the polysilicon layer 170 and the oxide layer 140 are removed to form the openings 182 shown in FIG. 1(c). The poly-emitter structures of the NPN and PNP transistors will be formed in the openings.

Figure 1D:
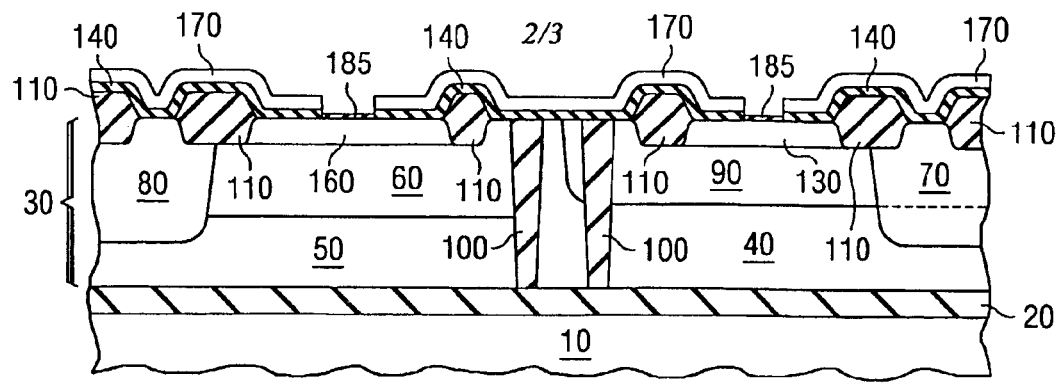

Following the removal of the patterned photoresist film 180 and prior to the formation of a second polysilicon layer the interfacial oxide (IFO) 185 is formed. As shown in FIG. 1(d) the IFO 185 is formed on the surface of the upper silicon layer 30 in the openings created in the polysilicon layer 170 and the oxide layer 140. The IFO should be between 2 to 40 angstroms (A) thick and any method suitable for forming oxide layers with thickness ranging from 2 A to 40 A can be used to form the IFO. In one embodiment of the instant invention the IFO 185 is formed in-situ in the same furnace in which the second polysilicon layer 190 is formed. Chemical processes such as an RCA clean can also be used to form the IFO 185.

Figure 1E:
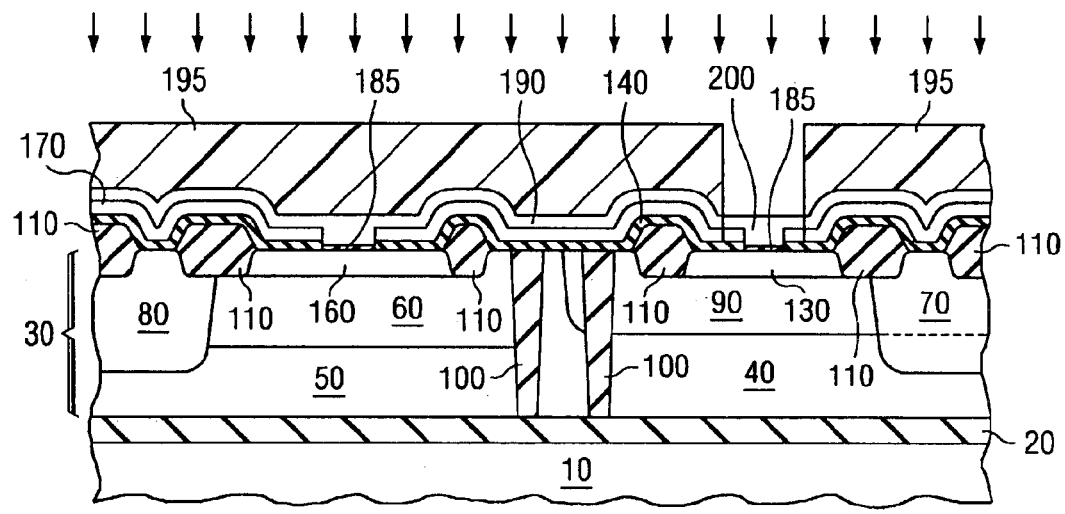

Following the formation of the IFO 185 the second polysilicon layer 190 is formed as shown in FIG. 1(e). As can be observed from the Figure, the IFO 185 is situated at the interface between the second polysilicon layer 190 and those regions of the upper silicon layer 30 where the crystalline emitter regions of the transistors will be formed. A patterned photoresist film 195 is then formed and p-type dopants are implanted into the exposed region 200 of the second polysilicon layer 190 as shown in FIG. 1(e). The p-type doped region 200 of the second polysilicon layer 190 will form the polysilicon region of the PNP transistor and will act as a dopant source during the formation of the crystalline emitter region of the PNP transistor.

Figure 1F:
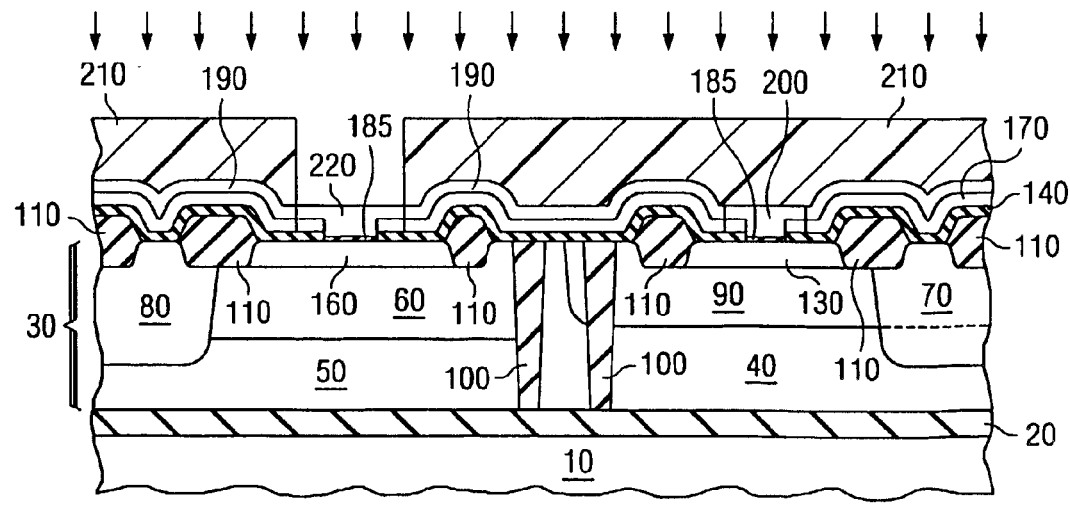

The n-type doped region 220 of the second polysilicon layer 190 shown FIG. 1(f) is formed in a similar manner. After removal of the patterned photoresist film 195, another patterned photoresist film 210 is formed with an opening that exposes region 220 of the second polysilicon layer 190. The exposed region 220 is then doped n-type by implanting suitable n-type dopant species. The n-type doped region 220 of the second polysilicon layer 190 forms the polysilicon emitter region of the NPN transistor and will act as a dopant source during the formation of the crystalline emitter region of the NPN transistor. In addition to n-type dopants, fluorine is also introduced into the polysilicon emitter region of the NPN transistor 220. The fluorine can be introduced by implanting a fluorine containing species in doses ranging from $1 \times 10^{15}$ cm$^{-2}$ to $1 \times 10^{16}$ cm$^{-2}$ at energies of 20 KeV to 70 KeV before or after the n-type dopants. The introduction of fluorine into the polysilicon emitter region of the NPN transistor 220 will reduce the 1/f noise caused by the presence of the IFO 185. This reduction in 1/f noise is crucial if the full benefits of the IFO 185 are to be realized in the PNP transistor. It should also be noted that fluorine is selectively introduced into the polysilicon emitter region of the NPN transistor 220 and not into the polysilicon emitter region of the PNP transistor 200.

Figure 1G:
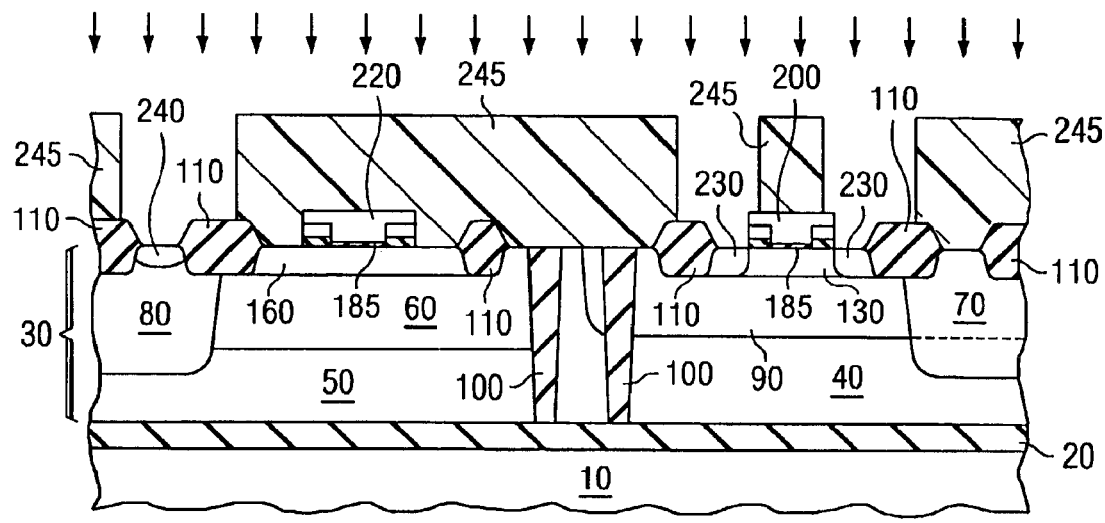
Figure 1H:
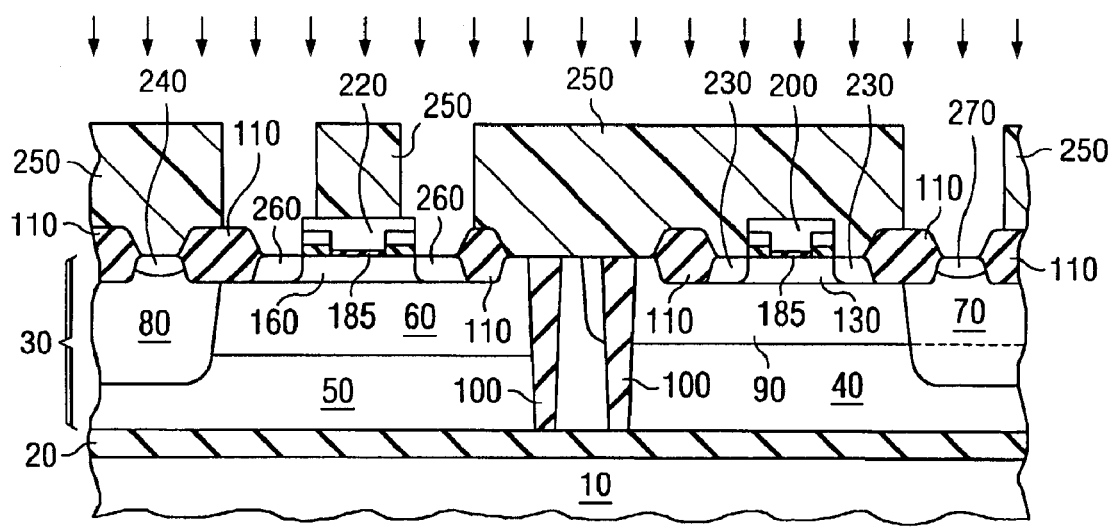

Following the formation of the polysilicon emitter regions 200 and 220 the remaining second polysilicon layer 190, polysilicon layer 170, and oxide layer 140 are removed using known patterning and etching techniques. The remaining polysilicon emitter structures 200 and 220 are shown in FIG. 1(g). A patterned photoresist film 245 is formed on the structure and used as an implant mask during the implantation of n-type dopant species. The n-type dopant species form the heavily doped n-type regions 230 and 240. These regions will be used to form electrical contacts to the base region 130 of the PNP transistor and the collector region 60 of the NPN transistor. Following the removal of the patterned film 245, heavily doped p-type regions 260 and 270 are formed by implanting p-type dopants into the upper silicon layer 30 using the patterned photoresist film 250 as an implant mask. This is shown in FIG. 1(h). These heavily doped p-type regions will be used to form electrical contacts to the p-type base region 160 of the NPN transistor and the p-type collector region 90 of the PNP transistor.

Figure 1I:
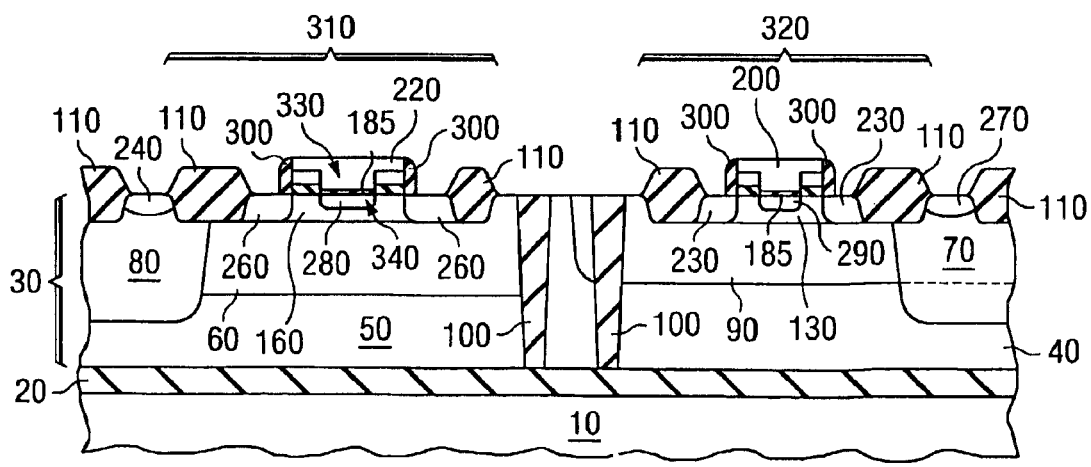

Following the removal of the patterned photoresist film 250 shown in FIG. 1(h), sidewall structures 300 are formed adjacent to the polysilicon emitter structures 200 and 220 as shown in FIG. 1(i). These sidewall structures 300 will provide isolation during the formation of silicide regions later in the integrated fabrication process. Following formation of the sidewall structures 300 a thermal anneal is performed. The thermal anneal will diffuse the dopant species from the polysilicon emitter regions 200 and 220 through the IFO 185 and into the underlying upper silicon region to form the crystalline emitter regions 280 and 290 of the NPN and PNP transistors respectively. Therefore the n-type crystalline emitter region of the NPN transistor 280 is formed by the thermal diffusion of n-type dopants from the n-type polysilicon emitter region 220. In additon to the n-type dopants the fluorine that was introduced into the polysilicon emitter region 220 will also diffuse to the interface of the polysilicon emitter 220 and the underlying IFO 185. In addition it is possible that the fluorine species could diffuse through the IFO and into the interface of the IFO 185 and the underlying crystalline emitter region 280.

Therefore referring to FIG. 1(i), the NPN transistor 310 of the instant invention comprises an n-type collector region 60, a p-type base region 160 next to the collector region and an n-type crystalline emitter region 280 contained in the p-type base region 160. The n-type polysilicon emitter region 220 is separated from the n-type crystalline emitter region 280 by an IFO layer 185. Fluorine is introduced into the polysilicon emitter region 220, the crystalline emitter region 280, the IFO contained in the NPN transistor 310, and at the IFO and polysilicon emitter interface 330 and the crystalline emitter and IFO interface 340 to reduce the 1/f noise in the NPN transistor.

In addition referring to FIG. 1(i), the PNP transistor 320 of the instant invention comprises an p-type collector region 90, a n-type base region 130 next to the collector region and an p-type crystalline emitter region 290 contained in the n-type base region 130. The p-type polysilicon emitter region 200 is separated from the p-type crystalline emitter region 280 by an IFO layer 185. In a first embodiment of the instant invention fluorine is selectively introduced into the polysilicon emitter region 220 of the NPN transistor and not into the polysilicon emitter region 200 of the PNP transistor. However in a further embodiment of the instant invention, fluorine is introduced into the polysilicon emitter region 200, the crystalline emitter region 290, the IFO contained in the PNP transistor 320, and at the various IFO, polysilicon emitter 200 and crystalline emitter 290 interfaces.

Following the formation of the NPN and PNP transistors the integrated circuit can be completed using known integrated circuit processing techniques.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. An integrated circuit, comprising:

a semiconductor substrate with an upper surface;

a n-type collector region contained in said semiconductor substrate;

a p-type collector region contained in said semiconductor substrate and separated from said n-type collector region;

a p-type base region contained in said n-type collector region;

a n-type base region contained in said p-type collector region;

a n-type emitter region with an upper surface contained in said p-type base region;

a p-type emitter region with an upper surface contained in said n-type base region;

a first interfacial oxide layer with an upper surface formed on said upper surface of said n-type emitter region;

a second interfacial oxide layer with an upper surface formed on said upper surface of said p-type emitter region;

a p-type polysilicon emitter layer formed on said upper surface of said second interfacial oxide layer wherein said p-type polysilicon emitter layer does not contain fluorine; and a n-type polysilicon emitter layer formed on said upper surface of said first interfacial oxide layer wherein said n-type polysilicon emitter layer contains fluorine.

2. The integrated circuit of claim 1 wherein said first and second interfacial oxide layers are between 2 and 40 angstroms thick.

3. The integrated circuit of claim 2 wherein said semiconductor substrate is a silicon on insulator substrate.

* * * * *